United States Patent
Timmermans et al.

(10) Patent No.: US 11,599,019 B2
(45) Date of Patent: Mar. 7, 2023

(54) METHOD FOR FORMING AN EXTREME ULTRAVIOLET LITHOGRAPHY PELLICLE

(71) Applicant: IMEC VZW, Leuven (BE)

(72) Inventors: Marina Timmermans, Bertem (BE); Cedric Huyghebaert, Heverlee (BE); Ivan Pollentier, Langdrop (BE); Elie Schapmans, Waanrode (BE); Emily Gallagher, Burlington, VT (US)

(73) Assignee: IMEC VZW, Leuven (BE)

( * ) Notice: Subject to any disclaimer, the term of this patent is extended or adjusted under 35 U.S.C. 154(b) by 167 days.

(21) Appl. No.: 17/131,297

(22) Filed: Dec. 22, 2020

(65) Prior Publication Data

US 2021/0191255 A1     Jun. 24, 2021

(30) Foreign Application Priority Data

Dec. 23, 2019 (EP) .................................. 19219382

(51) Int. Cl.
*G03F 1/64* (2012.01)
*G03F 1/62* (2012.01)

(52) U.S. Cl.
CPC . *G03F 1/64* (2013.01); *G03F 1/62* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| | | | |
|---|---|---|---|
| 9,759,997 | B2 | 9/2017 | Chen et al. |
| 9,952,502 | B2 | 4/2018 | Jeon et al. |
| 10,437,143 | B2 | 10/2019 | Jeon et al. |
| 2005/0272196 | A1 | 12/2005 | Wickramanayaka et al. |
| 2006/0258152 | A1 | 11/2006 | Haider |
| 2014/0061919 | A1 | 3/2014 | Cohen |
| 2018/0259844 | A1 | 9/2018 | Shin et al. |
| 2018/0259845 | A1 | 9/2018 | Nam et al. |
| 2018/0329289 | A1 | 11/2018 | Gallagher et al. |
| 2018/0329291 | A1 | 11/2018 | Timmermans et al. |

FOREIGN PATENT DOCUMENTS

| | | |
|---|---|---|
| EP | 3404486 A1 | 11/2018 |
| WO | 2019211083 A1 | 11/2019 |

OTHER PUBLICATIONS

Extended European Search Report and Written Opinion, EP Application 19219382.9, dated Jun. 12, 2020, 9 pages.
Timmermans, Marina Y., Ivan Pollentier, Jae Uk Lee, Johan Meersschaut, Olivier Richard, Christoph Adelmann, Cedric Huyghebaert, and Emily E. Gallagher. "CNT EUV pellicle: moving towards a full-size solution." In Photomask Technology 2017, vol. 10451, p. 104510P. International Society for Optics and Photonics, 2017.
Iyer, Ajai, Antti Kaskela, Serguei Novikov, Jarkko Etula, Xuwen Liu, Esko I. Kauppinen, and Jari Koskinen. "Effect of tetrahedral amorphous carbon coating on the resistivity and wear of single-walled carbon nanotube network." Journal of Applied Physics 119, No. 18 (2016): 185306.
Herrmann, Cari F., F. H. Fabreguette, D. S. Finch, R. Geiss, and S. M. George. "Multilayer and functional coatings on carbon nanotubes using atomic layer deposition." Applied Physics Letters 87, No. 12 (2005): 123110.
Timmermans, Marina Y., Marina Mariano, Ivan Pollentier, Olivier Richard, Cedric Huyghebaert, and Emily E. Gallagher. "Free-standing carbon nanotube films for extreme ultraviolet pellicle application." Journal of Micro/Nanolithography, MEMS, and MOEMS 17, No. 4 (2018): 043504.
Ma, He, Yang Wei, Jiangtao Wang, Xiaoyang Lin, Wenyun Wu, Yang Wu, Ling Zhang et al. "Freestanding macroscopic metal-oxide nanotube films derived from carbon nanotube film templates." Nano Research 8, No. 6 (2015): 2024-2032.

*Primary Examiner* — Christopher G Young
(74) *Attorney, Agent, or Firm* — McDonnell Boehnen Hulbert & Berghoff LLP

(57) ABSTRACT

According to an aspect of the present disclosure there is provided a method for forming an EUVL pellicle, the method comprising: coating a carbon nanotube, CNT, membrane, and mounting the CNT membrane to a pellicle frame, wherein coating the CNT membrane comprises: pre-coating CNTs of the membrane with a seed material, and forming an outer coating on the pre-coated CNTs, the outer coating covering the pre-coated CNTs, the forming of the outer coating comprising depositing a coating material on the pre-coated CNTs by atomic layer deposition.

17 Claims, 6 Drawing Sheets

Fig. 6a ALD ZrO₂ (22 cycles) without seed layer
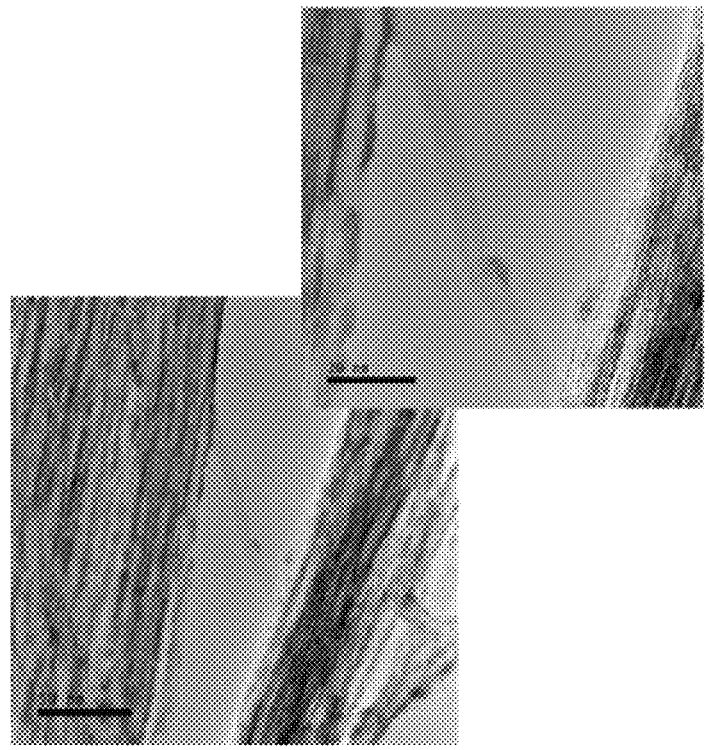
Fig. 6b ALD ZrO₂ (22 cycles) with Zr seed layer
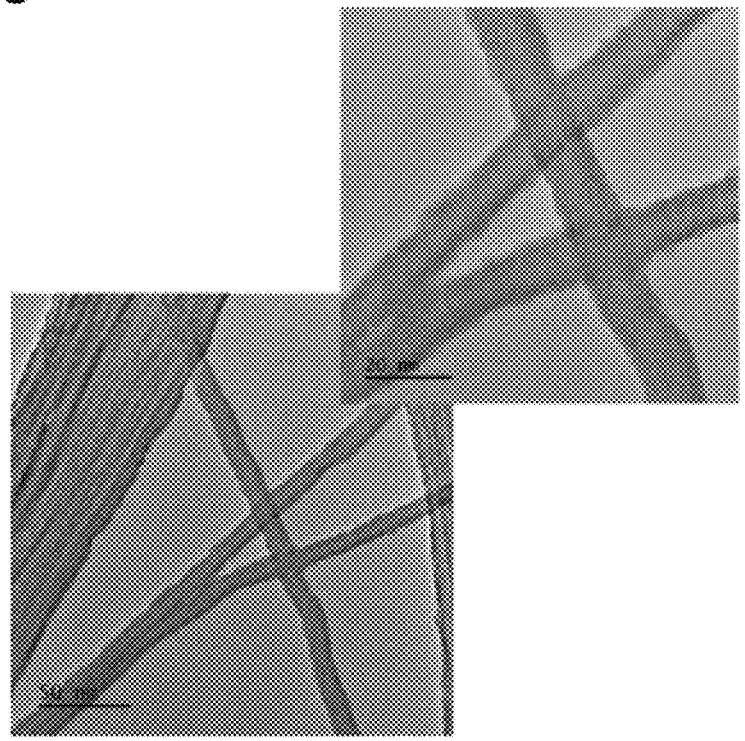

METHOD FOR FORMING AN EXTREME ULTRAVIOLET LITHOGRAPHY PELLICLE

CROSS-REFERENCE TO RELATED APPLICATIONS

The present application is a non-provisional patent application claiming priority to European Patent Application No. EP 19219382.9, filed Dec. 23, 2019, the contents of which are hereby incorporated by reference.

FIELD OF THE DISCLOSURE

The present disclosure relates to a method for forming an Extreme Ultraviolet Light pellicle.

BACKGROUND

To enable high volume manufacturing with extreme ultraviolet (EUV) lithography (EUVL), a pellicle is utilized to protect the reticle from any fall-on particles. An EUVL pellicle comprising a carbon nanotube (CNT) membrane is a promising pellicle solution, being transparent enough to limit the imaging impact while robust enough to survive handling and capable of stopping particles. A considerable major challenge remaining for realizing a CNT-based pellicle however is to make it withstand the hydrogen plasma environment of the EUV scanner during a large number of exposures, e.g. on the order of tens of thousands or more. It has been proposed to coat a CNT membrane to make it less sensitive to exposure to hydrogen plasma. However, due to the interconnected web-like structure of CNT membranes and the relatively inert CNT surfaces, achieving a coated CNT membrane with a sufficiently maintained high and uniform EUV transmission is not trivial.

SUMMARY

Embodiments of the present disclosure address this challenge and provide a method of forming an EUVL pellicle with a CNT-based pellicle membrane coated in an improved manner. Further and alternative embodiments may be understood from the following.

According to an aspect of the present inventive concept there is provided a method for forming an EUVL pellicle, the method comprising:
coating a carbon nanotube, CNT, membrane, and
mounting the CNT membrane to a pellicle frame,
wherein coating the CNT membrane comprises:
pre-coating CNTs of the membrane with a seed material, and
forming an outer coating on the pre-coated CNTs, the outer coating covering the pre-coated CNTs, the forming of the outer coating comprising depositing a coating material on the pre-coated CNTs by atomic layer deposition.

Atomic layer deposition (ALD) is a process allowing formation of atomically thin films or layers with a high degree of control and excellent uniformity. However, the small number of active sites for thin film anchoring and nucleation at the initial growth stage provided by CNTs (typically only provided by defect sites of the CNT membrane), ALD applied to CNTs tend to result in formation of localized islands resulting in CNT partially uncoated, even if a large number of ALD cycles are performed.

However, preceding the ALD with an act of pre-coating the CNTs (i.e. outer surfaces thereof) with a seed material allows the number of active sites available for the ALD process to be increased to such an extent that an outer coating with a sufficient degree of coverage and uniformity (for EUVL applications) may be obtained. In some examples, the outer coating is formed to completely encapsulate the pre-coated CNTs.

As may be appreciated, the membrane may comprise bundles of CNTs. Accordingly, pre-coating CNTs with a seed material may comprise pre-coating of exposed outer surfaces of the CNTs bundles. Correspondingly forming an outer coating on the pre-coated CNTs may comprise depositing the coating material on exposed outer surfaces of the CNT bundles and on pre-coated outer surfaces of the CNT bundles (i.e. CNT surfaces covered with seed material).

Pre-coating by a seed material enables the above-described functionalization to be achieved in a benign manner, compared to other techniques for functionalizing CNTs to reduce the surface inertness (e.g. ozone and plasma treatments to name a few). It is desirable that the coating process does not cause significant structural damage to the CNTs. Damaging the CNTs would undermine the mechanical stability and integrity of the CNT membrane, which is of considerable importance for the mechanical reliability and particle stopping function of the pellicle.

The CNT membrane may be a free-standing CNT membrane. The CNTs may be single-walled (SWCNT) or multi-walled (MWCNT). The term MWCNT as used herein is intended to encompass also double-walled CNTs (DWCNTs).

The CNT membrane may be pre-coated using a non-ALD deposition technique. A number of deposition techniques for depositing the seed material include physical vapor deposition (PVD) methods such as thermal or e-beam evaporation, remote plasma sputtering; and alternatively electrochemical deposition (ECD) and electroplating. A common denominator for these deposition techniques is that they are benign to the CNTs and allow forming of a seed material pre-coating which is both thin and provides a degree of coverage sufficient to allow a sufficiently uniform outer coating by ALD. Any of these techniques alone would not be able to produce a coating on a CNT membrane meeting the aforementioned design targets. However, combining seed material pre-coating step with an outer coating ALD step provides a synergistic effect of enabling a coating on a CNT membrane providing a reliable protection with a minimum impact on EUV transmission.

The seed material may be deposited to form a seed layer with an average thickness in a range of 0.5 to 4 nm, for example 0.5 to 3 nm, or 1 to 2 nm. As may be understood from the above, the pre-coating may not result in formation of a uniform and continuous layer. However, depositing seed material onto the CNTs until a seed layer with an average thickness in this range is obtained provides a sufficient number of nucleation sites to facilitate the subsequent ALD of the coating material, while keeping the seed layer thin to limit the total thickness of the coating (seed layer thickness plus outer coating thickness). By average thickness is an average thickness of the seed layer (which may be continuous or be formed of a plurality of discrete seed layer portions) over all exposed outer CNT surfaces (bundled or not) of the membrane.

The coating material may be deposited to form an outer coating with an average thickness in the range of 0.5 to 4 nm, for example 1 to 2 nm. An outer coating in these thickness ranges allows a reliable protection for the CNTs against the hydrogen plasma environment, while limiting impact on EUV transmission.

The seed material may be deposited at a rate of 0.7 angstroms/s or lower. A deposition rate of 0.7 angstroms/s or lower has been identified to allow seed material pre-coating of a sufficient quality, also for thin layers.

The seed material may be selected from the group of: C, Zr, ZrN, Hf, HfN, B, $B_4C$, BN, Y, YN, La, LaN, SiC, SiN, Ti, TiN, W, Be, Au, Ru, Al, Mo, MoN, Sr, Nb, Sc, Ca, Ni, Ni—P, Ni—B, Cu, Ag. These materials may provide a seeding function for a broad class of materials which may be deposited by ALD and which may form an outer coating with sufficient reliability and EUV transmission.

The coating material may be selected from the group of Zr, Al, B, C, Hf, La, Nb, Mo, Ru, Si, Ti or Y; or carbides, nitrides or oxides thereof.

The seed material and the coating material may be selected from the group of: Zr seed material and $ZrO_2$ coating material; B seed material and $ZrO_2$ coating material, $HfO_2$ coating material or $Al_2O_3$ coating material; $B_4C$ seed material and $ZrO_2$ coating material, $HfO_2$ coating material or $Al_2O_3$ coating material; Zr seed material and $Al_2O_3$ coating material or ZrAlOx coating material; Mo seed material and $ZrO_2$ coating material.

According to some embodiments, pre-coating the CNTs with seed material comprises depositing seed material by PVD. The seed material may be deposited by thermal evaporation or e-beam evaporation, or by remote plasma sputtering. Common for these deposition techniques is that they allow material to be deposited in thin films on CNTs, at relatively low temperatures and without introducing significant damage to the CNT structure.

Pre-coating the CNTs with seed material using PVD, such as any of the aforementioned techniques, may comprise depositing seed material (e.g. by evaporation or remote plasma sputtering) from a first side of the membrane and depositing seed material (e.g. by evaporation or remote plasma sputtering) from a second opposite side of the membrane. Thereby, seed material may first be deposited on a first side/first main surface of the membrane and then be deposited on a second side/second main surface of the membrane. This facilitates providing a pre-coating with a sufficient degree of coverage and uniformity for the subsequent ALD process.

The act of pre-coating the CNTs of the membrane may be performed in a deposition tool comprising a substrate holder supporting the membrane. Depositing seed material from the first side of the membrane may comprise mounting the membrane to the substrate holder with the first side/the first main surface of the membrane facing towards a seed material vapor flux. Correspondingly, depositing seed material from the second side of the membrane may comprise mounting the membrane to the substrate holder with the second side/the second main surface of the membrane facing towards a seed material vapor flux. As may be appreciated, orienting a side/main surface of the membrane towards the seed material flux implies orienting the side/main surface towards a crucible of the deposition tool holding the seed material source (i.e. the target material to be vaporized).

The act of pre-coating the CNTs of the membrane may be performed in a deposition tool comprising a substrate holder supporting the membrane. For a more uniform seed material deposition, the deposition of seed material may be performed during continuous rotation of the substrate holder. By rotating the substrate holder the membrane may be rotated in relation to a seed material vapor flux, or equivalently, in relation to a crucible of the deposition tool holding the seed material source (i.e. the target material to be vaporized target material). This enables a more even distribution of the seed material.

According to some embodiments, pre-coating the CNTs with seed material comprises depositing seed material by electrochemical deposition or electroplating. Common for these deposition techniques is that they allow material to be deposited in thin films on CNTs at relatively low temperatures while limiting a risk of damaging the CNT membrane.

The coating material may be deposited by thermal ALD or plasma enhanced ALD (PEALD). Thermal ALD may be even more benign to the CNTs than PEALD and may hence in some cases be desired.

The CNT membrane can be coated prior to being mounted to the pellicle frame.

Prior to the coating, the CNT membrane may be assembled with a membrane border.

BRIEF DESCRIPTION OF THE FIGURES

The above, as well as additional, features will be better understood through the following illustrative and non-limiting detailed description of example embodiments, with reference to the appended drawings.

FIG. 6a shows a comparative coating example obtained by ALD without a preceding pre-coating step, according to an example embodiment.

FIG. 6b shows a coating example with a preceding pre-coating step, according to an example embodiment

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
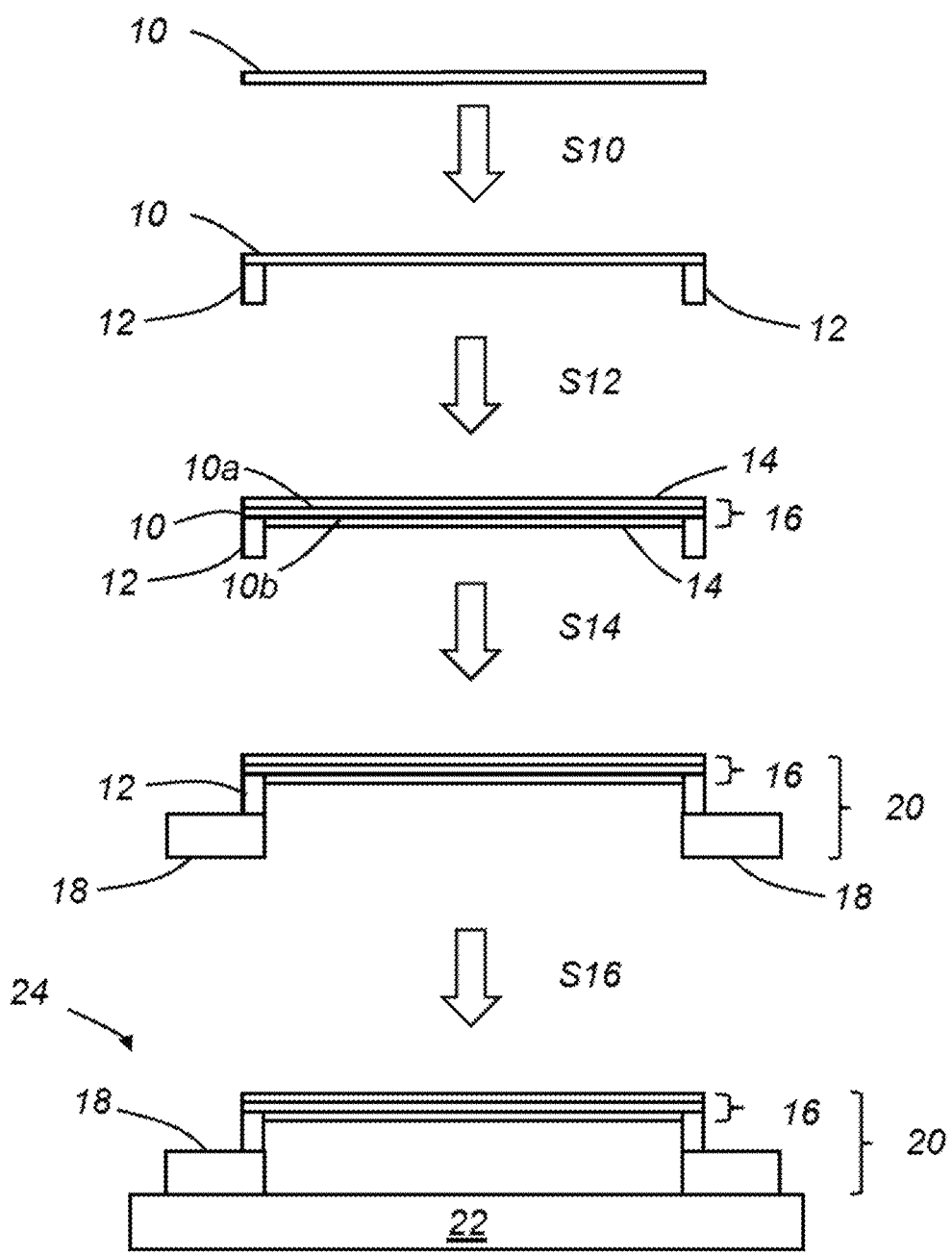
FIG. 1 is a schematic illustration of a EUVL pellicle and a reticle system, according to an example embodiment.

FIG. 1 schematically illustrates the basic structures and steps for fabrication of a EUVL pellicle 20 and of a reticle system 24 comprising the pellicle 20 and a reticle 22, (i.e. a "pelliclized reticle"). The structures in FIG. 1 are shown in a schematic cross-sectional side-views.

The pellicle 20 comprises a pellicle membrane 10, or shorter "membrane". The membrane 10 is a CNT membrane and may accordingly be formed by one or more layers of a CNT film, either of SWCNTs or MWCNTs. A SWCNT may be described as a cylindrical or tubular molecule of a single graphene sheet. SWCNTs may have a diameter in the range of 0.5-2 nm. MWCNTs may have a diameter in the range of 5-30 nm.

The membrane 10 may be formed as a free-standing CNT membrane. Properties of, as well as fabrication techniques for, free-standing CNT membranes are as such known and will therefore not be discuss in detail herein. For sake of completeness it is however noted that a CNT membrane being free-standing or self-supporting is capable of supporting its own weight when being suspended by (e.g. a pellicle frame). In other words, a free-standing CNT pellicle membrane is capable of supporting its own weight when having a size being relevant for use in lithography, without any appreciable sagging.

The CNT pellicle membrane may comprise a plurality of CNT films arranged on top of each other in a stacked fashion. The membrane 10 may for example comprise 1, 2, 3, 4 or more CNT films just to give a few non-limiting examples. Each CNT film may include a random or regular web or grid of CNTs. The CNT films may be bonded together so as to form the CNT pellicle membrane.

The CNTs may also form bundles, wherein a CNT film may be formed of a web of CNT bundles. By way of example, a CNT bundle may include for instance 2-20 individual CNTs. In a CNT bundle, individual CNTs may be aligned and joined along their longitudinal directions. CNTs of a bundle may also be joined end-to-end such that the length of the CNT bundle is greater than the length of the individual CNTs. The CNTs may typically be joined by van der Waals forces.

Still with reference to FIG. 1, the membrane 10 is assembled with a border 12 (as indicated by step S10). The membrane 10 may be attached to the border 12 along its edges. The membrane 10 may be attached to the border e.g. by an adhesive, by cold-welding, van der Waals bonding, or in any other conventional manner.

The membrane 10 is coated (as indicated by step S12). As will be disclosed in greater detail below, the coating process comprises a pre-coating step and a subsequent second coating step to form a coated membrane 16 having a coating 14 with a degree of coverage and uniformity desirable for EUVL applications. A portion of the coating 14 is formed on a first side or first main surface 10a of the membrane 10. A portion of the coating 14 is formed on a second side or second main surface 10b of the membrane 10 opposite the first side/first main surface.

The coated membrane 16 and the border 12 are assembled with a pellicle frame 18 (as indicated by step S14) to form the pellicle 20. The border 12 may be attached to the frame 18 for instance by an adhesive, by cold-welding or by some mechanical fixation structures such as clamps. The frame 18 may for instance be formed by Si, SiN, $SiO_2$ or quartz. However other materials are also possible, such as metal, plastic or ceramic materials.

Step S16 depicts assembly of the reticle system 24 comprising the pellicle 20 mounted over the reticle 22. The frame 18 may be attached to the reticle 22 using an adhesive. The reticle may be formed as a reflective reticle defining a pattern which is to be transferred to a wafer.

The membrane 10 may have a rectangular shape, although other shapes such as circular, oval or polygonal shapes also are conceivable. The border 12 and the frame 18 may have a shape corresponding to the shape of the membrane 10.

Assembling the membrane 10 and the border 12 prior to the coating process of step S12 as disclosed above may facilitate handling of the membrane 10 during the coating process. However, it is also possible to first coat the membrane 10 and thereafter assemble the coated membrane 10 with the border 12. It is also an option to omit a border and instead directly assemble a pellicle membrane with a pellicle frame, for instance by directly attaching the membrane to the frame using an adhesive.

It is to be noted that the relative dimensions of the elements shown in FIG. 1, such as the thickness dimensions and height/dimensions of the membrane 10 and the coating 14 relative to e.g. the border 12 and the frame 18, is merely schematic and may, for the purpose of illustrational clarity, differ from a physical structure.

Figure 2:
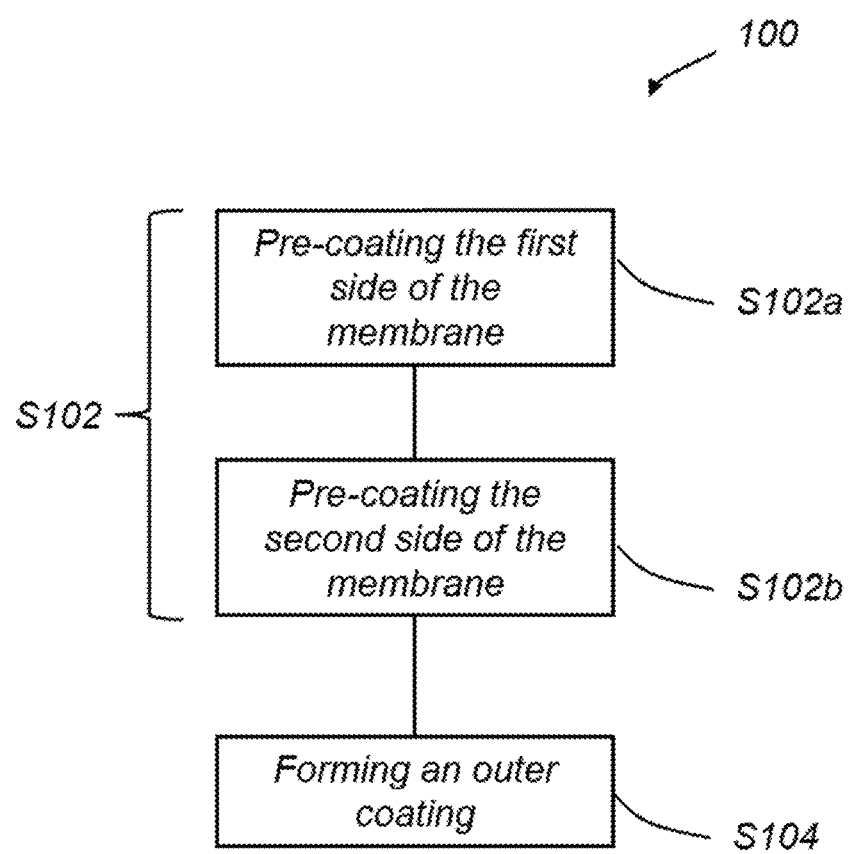
FIG. 2 is a flow chart of a method of coating a CNT pellicle membrane, according to an example embodiment.

FIG. 2 depicts a flow chart for a coating process 100 for forming a coating on a pellicle membrane, such as the coating 14 of the membrane 10 in FIG. 1. The coating process 100 comprises a pre-coating step S102 followed by a step S104 of forming an outer coating on the pre-coated membrane by ALD.

Figure 3:
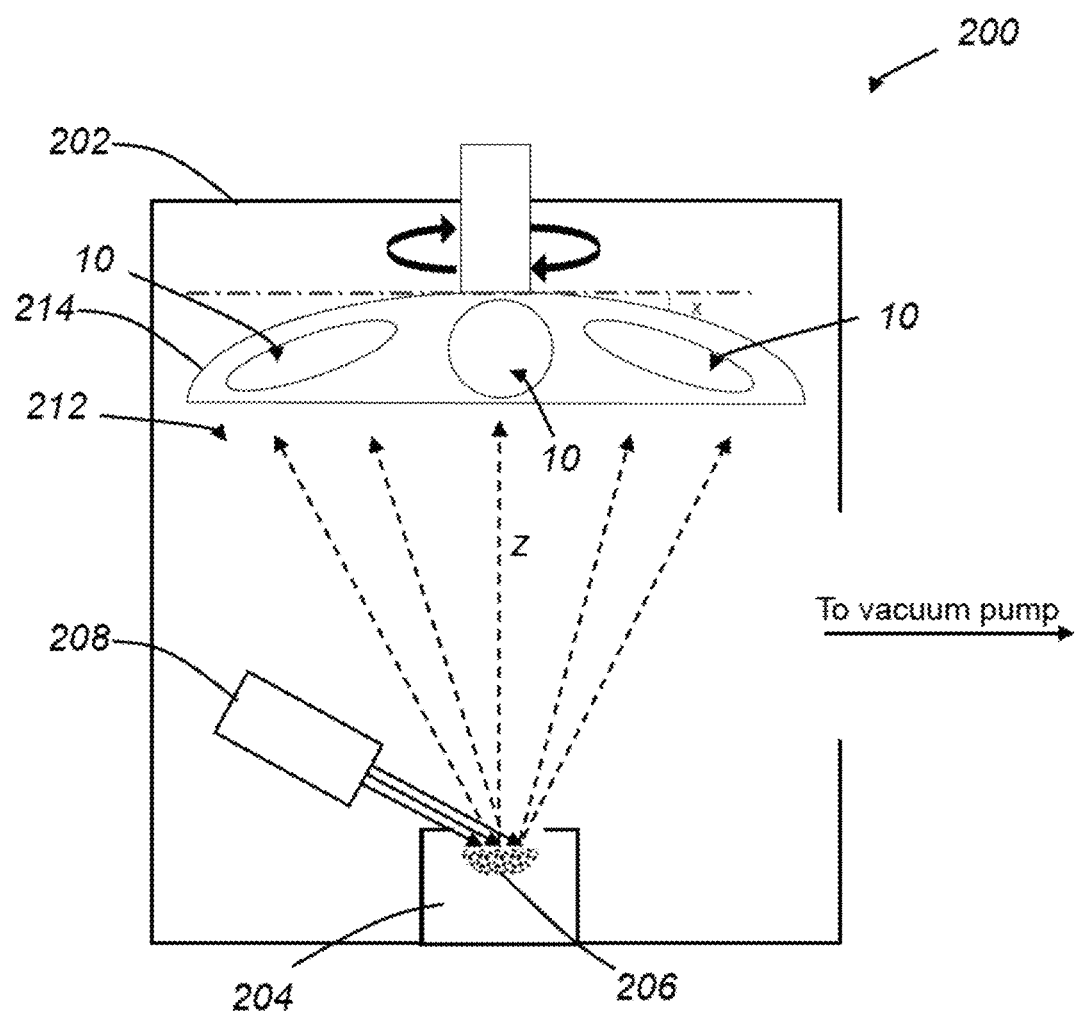
FIG. 3 is a schematic view of an e-beam evaporator tool, according to an example embodiment.

In more detail, the pre-coating step S102 may comprise depositing a seed material on CNTs of the membrane 10 by e-beam evaporation. FIG. 3 schematically depicts an e-beam evaporation device 200. The device 200 comprises a crucible 204 containing the target material 206. For the purpose of the pre-coating process the target material 206 is the seed material. The device 200 further comprises an e-beam source 208 and a substrate holder or deposition stage 214. The substrate holder 214 is adapted to support the pellicle membrane during the pre-coating process. The substrate holder 214 may as indicated be adapted to support more than one membrane 10 to allow pre-coating of plural membranes in parallel. The crucible 204 and the substrate holder 214 may be accommodated in a vacuum chamber 202 of the device 200. The vacuum chamber 202 may be evacuated by a vacuum pump.

In use, the e-beam source 208 emits a beam of electrons towards the target material which thereby evaporates to form a vapor flux 212 of the target/seed material towards the substrate holder 214. The arrows indicate line of sights from the crucible 204 (or equivalently from the target/source material 206) towards the substrate holder 214, wherein the arrow z denotes a major axis of the flux 212. The vapor will coat exposed surfaces of the membrane(s) 10 supported by the substrate holder 214. Thus, the target/seed material may be deposited to form a seed layer on the CNTs of the membrane 10.

To improve the uniformity of the seed layer deposition, the pre-coating step 102 may comprise a first sub-step S102a of pre-coating the first side 10a of the membrane 10 and a second sub-step S102b of pre-coating the second side of the membrane 10b. That is, the membrane 10 may first be arranged on the substrate holder 214 with the first side 10a facing towards the crucible 204, such that the first side 10a may face towards the vapor flux. Seed material may then be evaporated onto the membrane 10. The pre-coating process may then be interrupted wherein the membrane 10 may be re-oriented on the substrate holder 214 with the second side 10b facing towards the crucible 204, such that the second side 10b may face towards the vapor flux.

A further measure to improve the uniformity of the seed layer deposition may be to deposit the seed material during continuous rotation of the substrate holder 214. This may be performed during both the first and the second pre-coating sub-steps 102a, 102b.

A further measure to improve the uniformity of the seed layer deposition is to orient the membrane 10 such that the major flux axis z deviates from normal incidence (i.e. deviates from an angle of incidence of 0°) onto (a plane parallel to) the main surface of the membrane 10 facing the vapor flux 212. This may be achieved as indicated in FIG. 3 by an angled substrate holder 214. The angle x indicated in FIG. 3 corresponds to the major flux axis z deviation from normal incidence. The angle x may for example be in a range of 10-20° degrees. A non-zero angle of incidence, especially if combined with a continuous rotation during deposition, may allow CNT surfaces otherwise obscured by CNTs closer to the crucible along the line of sight to be exposed to the vapor flux 212 and thus be pre-coated with the seed material.

The seed material may generally be selected as any material which may provide a seeding function for the subsequent ALD step. The seed material may for example be selected from the following group: C, Zr, ZrN, Hf, HfN, B, $B_4C$, BN, Y, YN, La, LaN, SiC, SiN, Ti, TiN, W, Be, Au, Ru, Al, Mo, MoN, Sr, Nb, Sc, Ca, Ni, Ni—P, Ni—B, Cu, Ag.

Seed material may be evaporated onto the membrane 10 until a seed layer has been formed with an average thickness in a range of (e.g. 0.5 to 4 nm, 0.5 to 3 nm, or 1 to 2 nm). In practice an average thickness of the seed layer may be estimated by calculating an average thickness based on thickness measurements at a plurality of (randomly) selected measurement locations on the membrane 10. A seed layer quality may be improved by limiting a deposition rate. Experiments indicate that a seed material deposition rate of 0.7 angstroms/s or lower may yield a satisfying pre-coating quality. During evaporation, the gas flow across the membrane 10 may be controlled to ensure that the membrane 10 can withstand the pump/vent cycles. The vacuum chamber of the tool may be maintained at a pressure on the order of $10^{-5}$ mbar or lower, for example on the order of $10^{-6}$ mbar or lower.

Although the above described deposition tool 200 is an e-beam evaporator tool, it should be noted that a pre-coating step may be performed in a corresponding manner using also other PVD techniques, such as thermal evaporation (hereby intended to encompass non-e-beam techniques such as thermal evaporation e.g. by resistive heating evaporation, as well as molecular beam epitaxy) or remote plasma sputtering.

Subsequent to the pre-coating step S102, the membrane(s) 10 may be removed from the tool 200 and transferred to an ALD tool (not shown). The ALD tool may be of a conventional type such as a thermal ALD tool or a PE-ALD. If a PE-ALD is to be used a remote PE-ALD may be favorable due to the lower risk of damaging the CNTs of the pre-coated membrane 10 with the plasma. In the ALD tool, a coating material may be deposited/epitaxially grown on the pre-coated CNTs of the membrane 10 to form an outer coating covering the same.

In line with the above discussion, the seed material/seed layer pre-coated on the CNTs of the membrane 10 increases the number of active sites available for the ALD process. For example, the outer coating may be formed to completely encapsulate the pre-coated CNTs of the membrane 10.

The coating material may generally be selected as any material which may be deposited by ALD, provide sufficient protection of the CNTs against the hydrogen atmosphere, and enable an outer coating with sufficient EUV transmission. The coating material may be selected from the group of: Zr, Al, B, C, Hf, La, Nb, Mo, Ru, Si, Ti or Y. Carbides, nitrides or oxides of the aforementioned species are also possible coating materials.

The coating material may be deposited to form an outer coating with an average thickness in the range of for example 0.5 to 4 nm, or 1 to 2 nm. Increasing the thickness further may result in a too low EUV transmission of the membrane 10.

Combinations of seed material and coating material which may be suitable for the intended EUVL application include:

pre-coating with Zr followed by ALD of $ZrO_2$, $Al_2O_3$ or ZrAlOx pre-coating with B followed by ALD of $ZrO_2$, $HfO_2$ or $Al_2O_3$, pre-coating with $HfO_2$ followed by ALD of $Al_2O_3$, pre-coating with $B_4C$ followed by ALD of $ZrO_2$, $Al_2O_3$ or $HfO_2$;

pre-coating with Mo seed followed by ALD of $ZrO_2$.

A $ZrO_2$ ALD coating may for example be deposited at a temperature in a range of 280-350° C., such as 300° C. Precursor gases such as $ZrCl_4$ and $H_2O$ may be alternately pulsed into the vacuum chamber. A growth rate of the coating may e.g. be 0.04-0.06 nm/cycle, such as 0.05 nm/cycle. A reduced growth rate facilitates thickness control for the coating layer, also for very thin coating layers. As may be appreciated, these process conditions and precursors are merely examples and the process conditions and/or precursor combinations may vary for different coating materials and ALD tools.

Figure 4A:
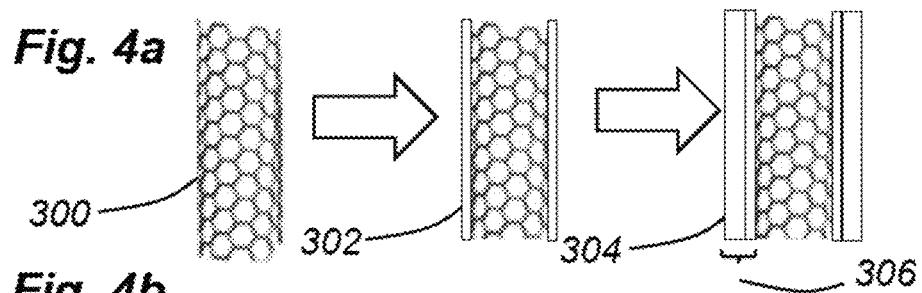
FIG. 4a is a coating example obtained by an ALD step subsequent to a pre-coating step, according to an example embodiment.
Figure 4B:
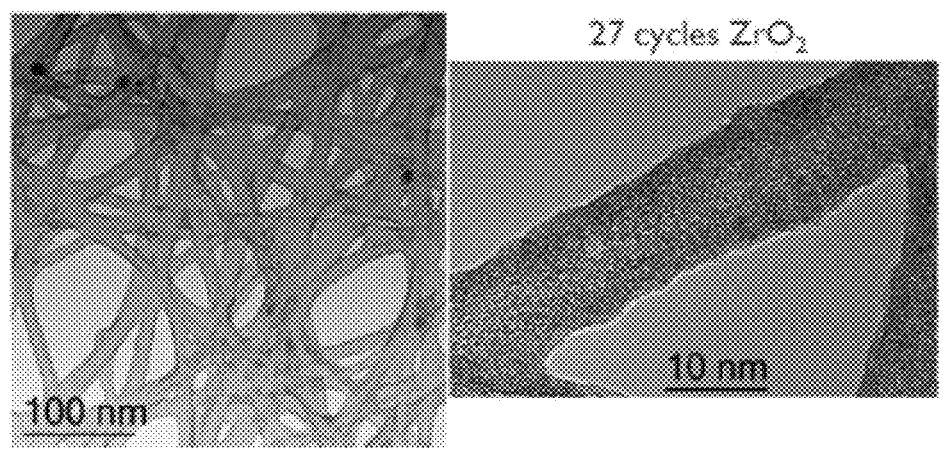
FIG. 4b is another coating example obtained by an ALD step subsequent to a pre-coating step, according to an example embodiment.

FIG. 4a is a schematic depiction of the above described coating process showing a SWCNT 300 which may represent a CNT of a membrane, such as the membrane 10 in FIG. 1, prior to pre-coating (left), subsequent to pre-coating with a seed material forming a seed layer 302 (center), and finally forming an outer coating by ALD 304 (right). The seed layer 302 and the outer ALD coating 304 forms a combined coating 306 (corresponding e.g. to the coating 14 in FIG. 1). FIG. 4b shows SEM images of a portion of a SWCNT membrane coated in a corresponding manner: The CNTs have been pre-coated with a $B_4C$ seed layer of an average thickness of 1 nm. An outer coating has been formed on the $B_4C$ pre-coated CNTs by ALD $ZrO_2$ (27 cycles). As may be seen a uniform outer coating encapsulating the CNTs has been obtained.

Figure 5A:
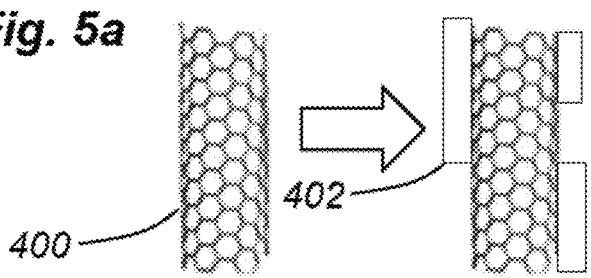
FIG. 5a shows a comparative coating example obtained by an ALD step without a preceding pre-coating step, according to an example embodiment.
Figure 5B:
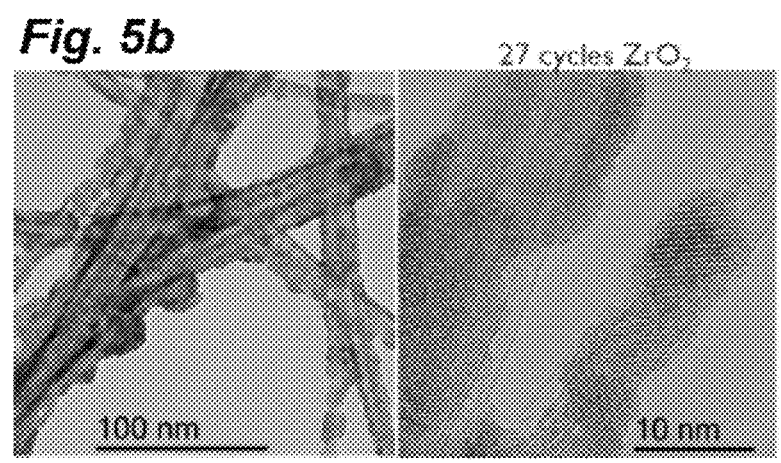
FIG. 5b shows a comparative coating example obtained by an ALD step without a preceding pre-coating step, according to an example embodiment.

FIG. 5a is a schematic depiction of a comparative coating process where a SWCNT 400 is coated by ALD without a preceding pre-coating step. As may be seen the result is an incomplete and non-uniform coating 402. FIG. 5b shows SEM images of a SWCNT membrane coated in a corresponding manner, i.e. by ALD without a preceding pre-coating step. As may be seen a non-uniform in-complete coating has been obtained.

FIG. 6 shows SEM images of a MWCNTs coated by ALD $ZrO_2$ (22 cycles) without (FIG. 6a) and with (FIG. 6b) a preceding e-beam pre-coating by Zr. FIG. 6a shows a comparably non-uniform and particle-like coating. In comparison, FIG. 6b shows a uniform coating. An average thickness of the outer coating in FIG. 6b is approximately 2.8 nm.

Figure 7:
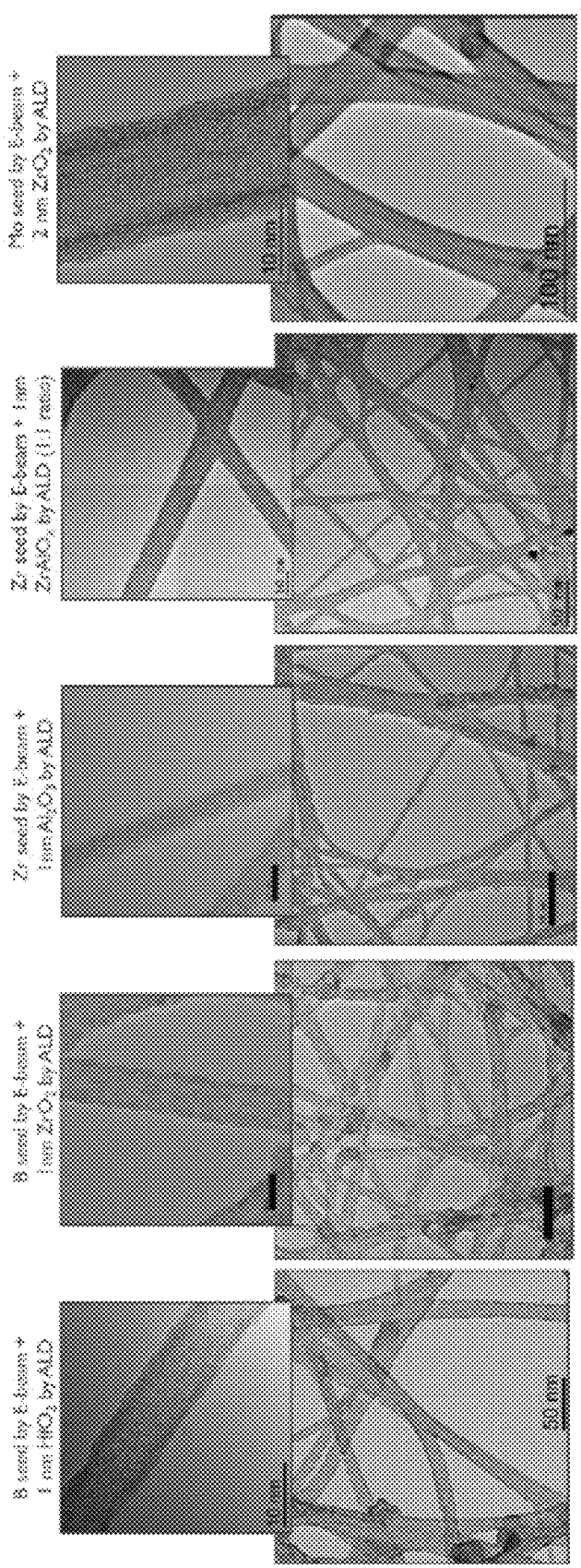
FIG. 7 shows a number of further examples of coatings obtained by an ALD step subsequent to a pre-coating step.

FIG. 7 shows SEM images of different ALD coatings on SWCNTs pre-coated by e-beam evaporation. Again, the uniformity of the coating is apparent.

In the above, important aspects of the disclosure have mainly been described with reference to a limited number of examples. However, as is readily appreciated by a person skilled in the art, other examples than the ones disclosed above are equally possible within the scope of the present disclosure, as defined by the appended claims.

For example, although in the above pre-coating has been discussed mainly with reference to PVD-techniques other processes for pre-coating the CNT membrane are possible. For example, the CNTs may be pre-coated with seed material by electrochemical deposition (ECD), electroless plating or electroplating. Electroplating, as well as electroless plating may comprise submerging the membrane (e.g. the membrane 10 either before or after assembly with the border 12) in a solution specific to the seed material which is to be deposited on the CNTs. In electroplating, the membrane 10 additionally can be connected to a current source. In either case, seed material may be deposited on the CNTs of the membrane to form thin seed layer thereon. The pre-coated membrane may thereafter be provided with an outer coating using ALD, as discussed above.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming an Extreme Ultraviolet Lithography (EUVL) pellicle, the method comprising:
   coating a carbon nanotube (CNT) membrane; and
   mounting the CNT membrane to a pellicle frame;
      wherein coating the CNT membrane comprises:
         pre-coating CNTs of the membrane with a seed material, wherein the seed material is deposited at a rate of 0.7 angstroms/s or lower; and
         forming an outer coating on the pre-coated CNTs, the outer coating covering the pre-coated CNTs, the forming of the outer coating comprising depositing a coating material on the pre-coated CNTs by atomic layer deposition.

2. The method according to claim 1, wherein the seed material is deposited to form a seed layer with an average thickness in a range of 0.5 to 4 nm.

3. The method according to claim 1, wherein the seed material is deposited to form a seed layer with an average thickness in a range of 0.5 to 3 nm.

4. The method according to claim 1, wherein the seed material is deposited to form a seed layer with an average thickness in a range of 1 to 2 nm.

5. The method according to claim 1, wherein the coating material is deposited to form an outer coating with an average thickness in the range of 0.5 to 4 nm.

6. The method according to claim 1, wherein the coating material is deposited to form an outer coating with an average thickness in the range of 1 to 2 nm.

7. The method according to claim 1, wherein the seed material is selected from the group of:
   C, Zr, ZrN, Hf, HfN, B, $B_4C$, BN, Y, YN, La, LaN, SiC, SiN, Ti, TiN, W, Be, Au, Ru, Al, Mo, MoN, Sr, Nb, Sc, Ca, Ni, Ni—P, Ni—B, Cu, and Ag.

8. The method according to claim 1, wherein the coating material is Zr, Al, B, C, Hf, La, Nb, Mo, Ru, Si, Ti, or Y, or carbides, nitrides, or oxides thereof.

9. The method according to claim 1, wherein the seed material and the coating material are selected from the group of: Zr seed material and $ZrO_2$ coating material; B seed material and $ZrO_2$ coating material, $HfO_2$ coating material or $AhO_3$ coating material; $B_4C$ seed material and $ZrO_2$ coating material, $HfO_2$ coating material or $AhO_3$ coating material; Zr seed material and $AhO_3$ coating material or $ZrAlO_3$ coating material; Mo seed material and $ZrO_2$ coating material.

10. The method according to claim 1, wherein pre-coating the CNTs with seed material comprises depositing seed material by physical vapor deposition.

11. The method according to claim 10, wherein the seed material is deposited by thermal evaporation, e-beam evaporation or remote plasma sputtering.

12. The method according to claim 10, wherein pre-coating the CNTs with seed material comprises depositing seed material from a first side of the membrane and then depositing seed material from a second opposite side of the membrane.

13. A method according to claim 12, wherein pre-coating is performed in a deposition tool comprising a substrate holder supporting the membrane, and wherein the deposition of seed material is performed during continuous rotation of the substrate holder.

14. The method according to claim 1, wherein pre-coating the CNTs with seed material comprises depositing seed material by electrochemical deposition or electroplating.

15. The method according to claim 1, wherein the coating material is deposited by thermal atomic layer deposition.

16. The method according to claim 1, wherein the CNT membrane is coated prior to being mounted to the pellicle frame.

17. A method for forming an Extreme Ultraviolet Lithography (EUVL) pellicle, the method comprising:
   coating a carbon nanotube (CNT) membrane; and
      mounting the CNT membrane to a pellicle frame;
      wherein coating the CNT membrane comprises:
         pre-coating CNTs of the membrane with a seed material by physical vapor deposition, wherein the seed material is deposited at a rate of 0.7 angstroms/s or lower; and
         forming an outer coating on the pre-coated CNTs, the outer coating covering the pre-coated CNTs, the forming of the outer coating comprising depositing a coating material on the pre-coated CNTs by atomic layer deposition.

* * * * *